# (12) United States Patent
Hyun

(10) Patent No.: US 7,696,087 B2
(45) Date of Patent: Apr. 13, 2010

(54) METHOD OF FORMING A DUAL DAMASCENE PATTERN OF A SEMICONDUCTOR DEVICE

(75) Inventor: Chan Sun Hyun, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 129 days.

(21) Appl. No.: 12/164,007

(22) Filed: Jun. 28, 2008

(65) Prior Publication Data
US 2009/0163032 A1 Jun. 25, 2009

(30) Foreign Application Priority Data
Oct. 10, 2007 (KR) .............................. 2007-102165

(51) Int. Cl.
*H01L 21/4763* (2006.01)
(52) U.S. Cl. ................ 438/637; 438/638; 257/E21.577
(58) Field of Classification Search ................ 438/706, 438/637, 638, 639; 257/E21.577
See application file for complete search history.

(56) References Cited

U.S. PATENT DOCUMENTS 6,518,591 B1 * 2/2003 Shamble et al. ............... 257/48
6,774,031 B2 * 8/2004 Ali et al. ..................... 438/638
6,800,551 B2 * 10/2004 Nagahara et al. ............ 438/638
7,253,115 B2 * 8/2007 Tanaka et al. ............... 438/706
7,396,633 B2 * 7/2008 Nagahara et al. ......... 430/270.1

FOREIGN PATENT DOCUMENTS

KR 1020030096730 A 12/2003
KR 1020040025287 A 3/2004

* cited by examiner

*Primary Examiner*—Michael Trinh
(74) *Attorney, Agent, or Firm*—Townsend and Townsend and Crew LLP

(57) ABSTRACT

In a method of forming a dual damascene pattern of a semiconductor device, horns that occur while forming a trench constituting the dual damascene pattern are removed in an intermediate process of forming the trench. Thus, the source of particles, which occur due to the horns in a cleaning process performed after the dual damascene pattern is formed, may be removed. Accordingly, an increase of contact resistance due to particles may be prevented, and a reduction in the yield of semiconductor devices may also be improved.

20 Claims, 5 Drawing Sheets

METHOD OF FORMING A DUAL DAMASCENE PATTERN OF A SEMICONDUCTOR DEVICE

CROSS-REFERENCES TO RELATED APPLICATIONS

The present application claims priority to Korean patent application number 10-2007-0102165, filed on Oct. 10, 2007, which is incorporated by reference in its entirety.

BACKGROUND OF THE INVENTION

The present invention relates to a method of forming a dual damascene pattern of a semiconductor device and, more particularly, to a method of forming a dual damascene pattern of a semiconductor device, which can effectively remove horns existing at the boundary portions of a contact hole and a trench constituting the dual damascene pattern.

With the high integration of semiconductor devices, an alignment margin of a contact plug and an upper structure (for example, a line or contact pad) becomes short. Accordingly, a dual damascene process that is able to form the contact plug and the upper structure at the same time has been applied.

The dual damascene process includes several methods. One of the methods is described below as an example. First, a contact hole is formed by etching an inter-metal dielectric layer using a mask for the contact hole. The inside of the contact hole is gap-filled with a passivation layer. An insulating layer and the passivation layer are etched using a mask to form a trench connected to the contact hole. The passivation layer remaining within the contact hole is removed. Thus, a dual damascene pattern comprised of the contact hole and the trench is formed. A cleaning process is performed and the dual damascene pattern is gap-filled with a conductive material. Accordingly, a contact plug is formed in the contact hole, and a line or contact pad is formed in the trench.

However, during the etch process of forming the trench, the trench is etched while a polymer layer is formed around the contact hole. Therefore, a greater amount of the inter-metal dielectric layer remains at the entrance of the contact hole than at other portions, causing a horn shape (refer to 100 of FIG. 1). The horn shape is bent in a cleaning process. As a result, the bent horn shape may become a particle source.

BRIEF SUMMARY OF THE INVENTION

The present invention is directed to preventing a horn shape from being formed at the entrance of a contact hole in the completion step of forming a trench by removing the horn shape in an intermediate step of forming the trench.

According to an aspect of the present invention, there is provided a method of forming a dual damascene pattern of a semiconductor device. According to the method, an insulating layer is formed over a semiconductor substrate on which elements of the semiconductor device are formed. A contact hole is formed in the insulating layer. A passivation layer is formed on the insulating layer and within the contact hole. A hard mask pattern is formed on the passivation layer. The hard mask pattern exposes the contact hole. A first trench is formed by etching a portion of the passivation layer and a portion of the insulating layer using a first etch process employing the hard mask pattern as an etch mask. The passivation layer, which is gap-filled within the contact hole, is etched using a second etch process employing the hard mask pattern as an etch mask. A second trench is formed by etching a portion of the insulating layer using a third etch process employing the hard mask pattern as an etch mask, thereby completing a third trench comprised of the first trench and the second trench. The hard mask pattern and the passivation layer are removed.

The insulating layer may be formed from oxide material.

The passivation layer may be formed from a bottom anti-reflection coating (BARC) material.

The first trench has a depth, which may be 5% to 50% shallower than that of the third trench.

The second etch process may be carried out until a top surface of the passivation layer gap-filled within the contact hole becomes at least lower than a bottom of the third trench.

The second etch process may be performed using a dry etch method such that the passivation layer below the third hard mask pattern is not etched.

The second etch process may be performed using gas with a high etch selectivity for the passivation layer relative to the insulating layer.

The second etch process may be performed using an etch gas, including a mixture of $CF_4$ gas and $O_2$ gas, or $O_2$ gas.

The first etch process and the second etch process may be performed using an in-situ method or an ex-situ method.

After the hard mask pattern and the passivation layer are removed, a cleaning process may be further performed.

DESCRIPTION OF SPECIFIC EMBODIMENTS

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention. The present invention is defined by the category of the claims.

FIGS. 2A to 2I are sectional views illustrating a method of forming a dual damascene pattern of a semiconductor device in accordance with the present invention.

Figure 1:
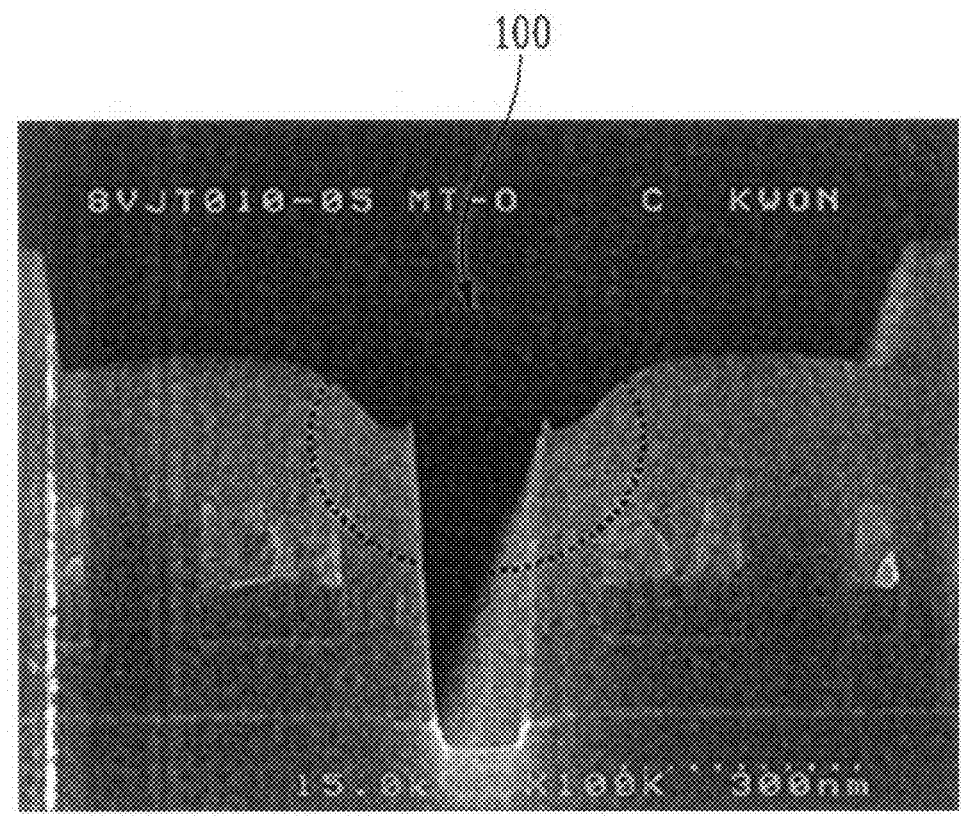
FIG. 1 is a photograph showing a contact hole of a conventional semiconductor device.
Figure 2A:
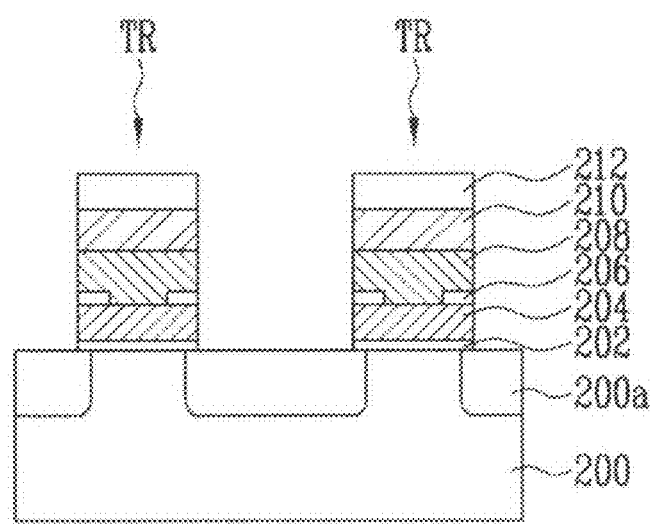
FIGS. 2A to 2I are sectional views illustrating a method of forming a dual damascene pattern of a semiconductor device in accordance with the present invention.

Referring to FIG. 2A, a semiconductor substrate 200 is provided with elements of a semiconductor device, such as gate patterns TR. In the case of a flash device, the gate pattern TR may be a memory cell, a select transistor or a high voltage transistor. In the drawings, it is assumed that the gate pattern TR is the select transistor or the high voltage transistor.

Each of the gate patterns TR has a stacked structure of a gate insulating layer 202, a first conductive layer 204, a dielectric layer 206, a second conductive layer 208, and a third conductive layer 210. A first hard mask pattern 212 is formed on the third conductive layer 210. When the gate pattern TR is the select transistor or the high voltage transistor as shown in the drawing, the first conductive layer 204 and the second conductive layer 208 are connected to serve as a gate electrode together with the third conductive layer 210. The first conductive layer 204 may serve as a floating gate electrode of a memory cell, and the second and third conductive layers 208 and 210 may serve as a control gate electrode of the memory cell. The second conductive layer 208 is generally formed from polysilicon, and the third conductive layer 210 is generally made of metal to improve the resistance of an electrode. Reference numeral 200a denotes junctions.

Figure 2B:
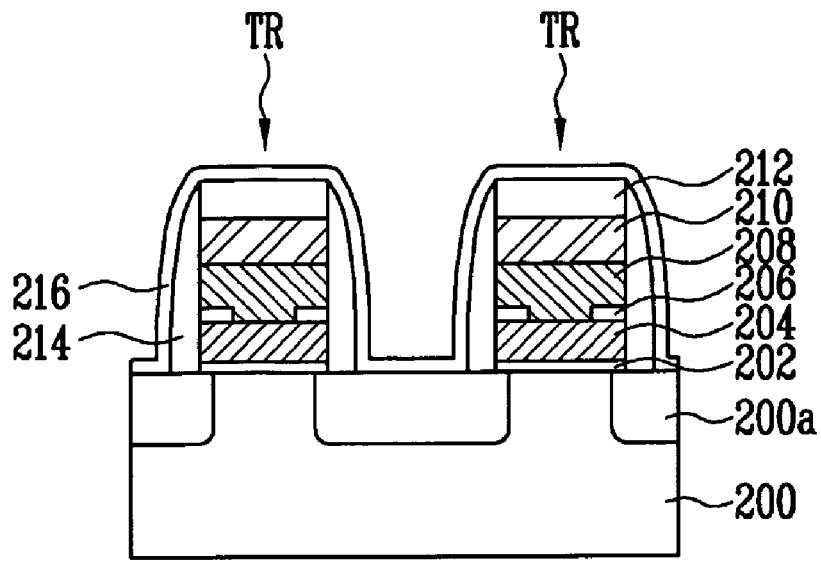

Referring to FIG. 2B, a spacer 214 is formed on sidewalls of the gate patterns TR. A first insulating layer 216 is formed on surfaces of the semiconductor substrate 200, the spacer 214, and the first hard mask layer 212. The spacer 214 and the first insulating layer 216 may be formed of a nitride layer.

Figure 2C:
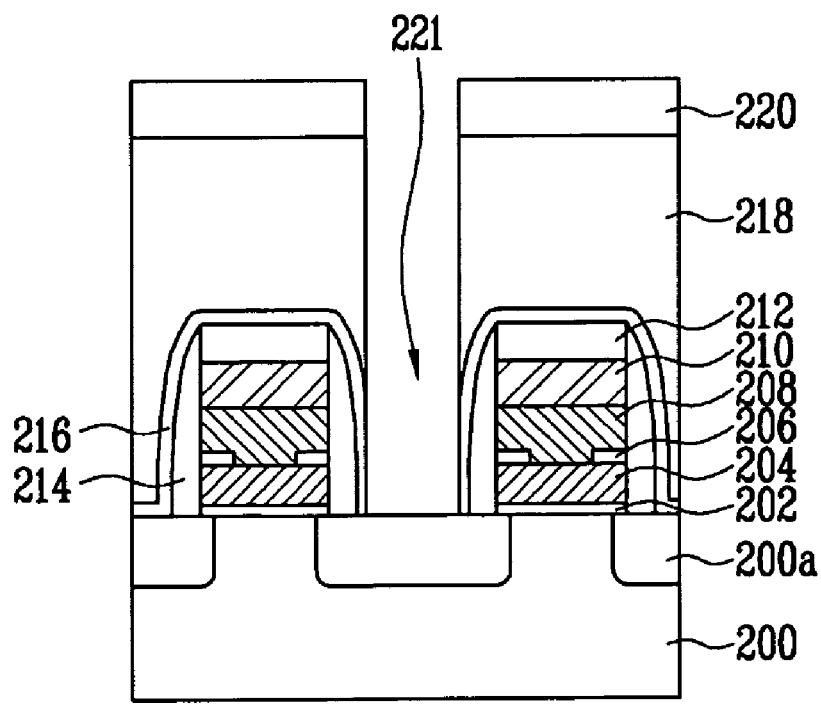

Referring to FIG. 2C, a second insulating layer 218 is formed on the first insulating layer 216 for interlayer insulation. In order to perform a first step of a dual damascene process, a second hard mask pattern 220 through which a portion of the junction 200a is exposed is formed on the second insulating layer 218. The second insulating layer 218 and the first insulating layer 216 are etched using an etch process using the second hard mask pattern 220 as an etch mask until the junction 200a is exposed, thereby forming a contact hole 221.

The second insulating layer 218 may be formed from oxide material.

Figure 2D:
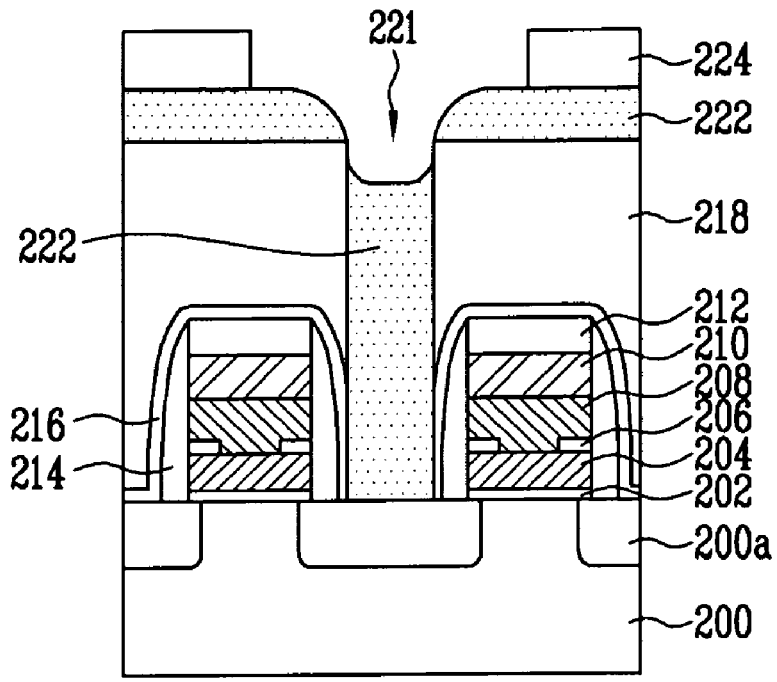

Referring to FIG. 2D, the second hard mask pattern 220 is removed. In order to perform a second step of a dual damascene process, a passivation layer 222 is formed on the second insulating layer 218 and within the contact hole 221. A third hard mask pattern 224 is formed on the passivation layer 222. The third hard mask pattern 224 is formed such that the contact hole 221 is exposed.

The passivation layer 222 may be formed from a bottom anti-reflection coating (BARC) material with fluidity so that the inside of the contact hole 221 is gap-filled. The passivation layer 222 functions as an anti-reflection layer when forming the third hard mask pattern 224, and also functions to prevent the junction 200a at the bottom of the contact hole 221 from being etched and damaged in a subsequent etch process.

Figure 2E:
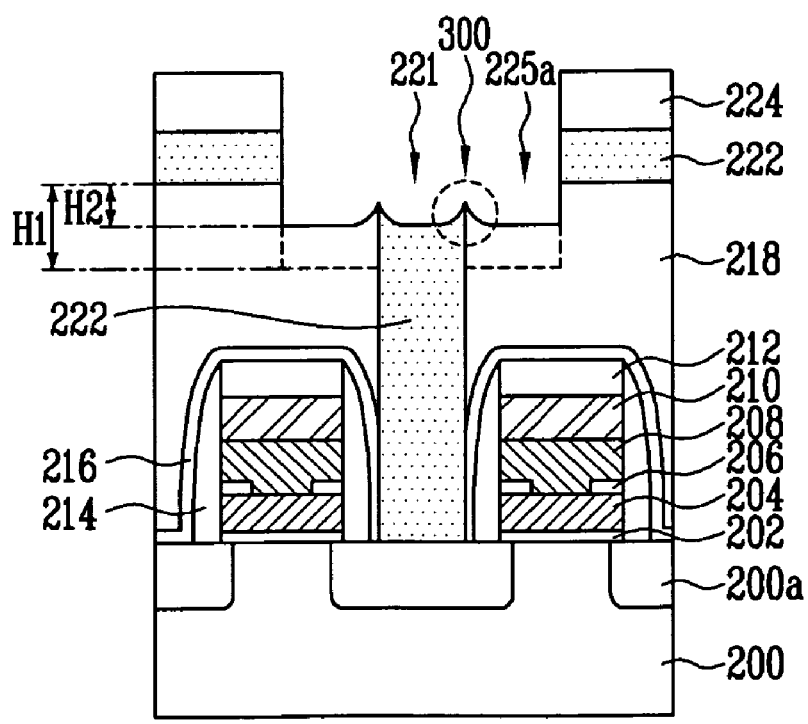

Referring to FIG. 2E, a first trench 225a is formed by etching a portion of the passivation layer 222 and a portion of the second insulating layer 218 using a first etch process employing the third hard mask pattern 224 as an etch mask. Horns 300 are generated on the second insulating layer 218 near the entrance of the contact hole 221 at the bottom of the first trench 225a. The horns 300 are generated because, as etching is performed while a polymer layer is formed around the contact hole 221 during the first etch process, a greater amount of the second insulating layer 218 remains at the entrance of the contact hole 221 than at other portions.

The first etch process is carried out until the depth of the trench becomes a depth H2, which is 5% to 50% smaller than a depth H1 set in the design rule of a device. In other words, the first trench 225a formed by the first etch process has the depth H2, which is 5% to 50% shallower than the depth H1 of the trench set in the design rule of a device.

Figure 2F:
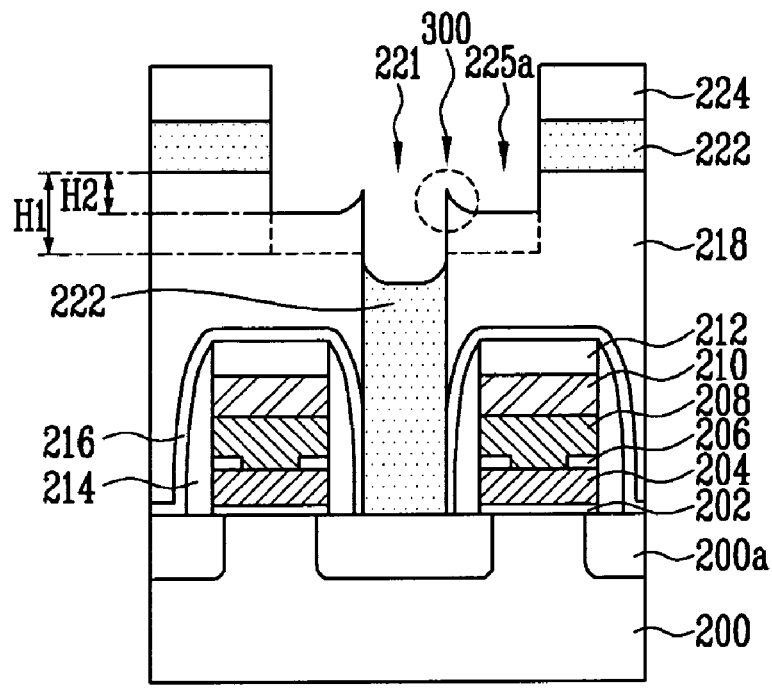

Referring to FIG. 2F, the passivation layer 222 gap-filled within the contact hole 221 is etched using a second etch process employing the third hard mask pattern 224 as an etch mask.

The second etch process may be performed until a top surface of the passivation layer 222, gap-filled within the contact hole 221, becomes lower than the depth H1 of the trench, which is set in the design rule of a device. The second etch process may be performed using a dry etch method such that the passivation layer 222 under the third hard mask pattern 224 is not etched. In the second etch process, gas having a high etch selectivity for the passivation layer 222 relative to the second insulating layer 218 may be used. For example, during the second etch process, an etch gas may include a mixture of $CF_4$ gas and $O_2$ gas, or $O_2$ gas.

The first etch process and the second etch process may be performed using an in-situ method or an ex-situ method.

Figure 2G:
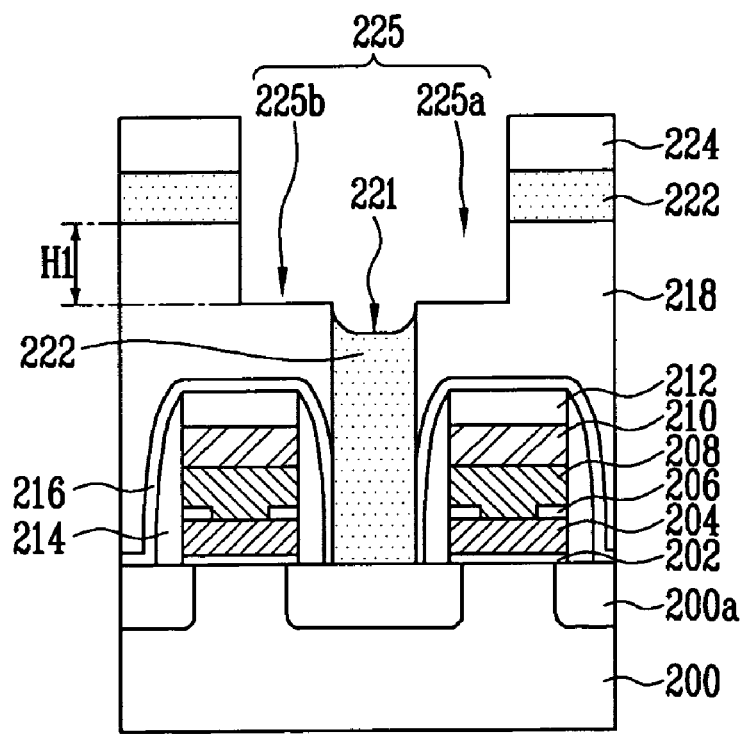

Referring to FIG. 2G, a second trench 225b is formed by etching the second insulating layer 218 to the depth H1 of the trench, which is set in the design rule of a device, using a third etch process employing the third hard mask pattern 224 as an etch mask. Accordingly, a third trench 225, comprising the first trench 225a and the second trench 225b, is formed.

While the third etch process is carried out, the horns 300 are removed. This is because an etch rate is faster at corners than on a plane in terms of the etch characteristic, so that the horns 300 that are jagged and prominent can be easily removed.

Figure 2H:
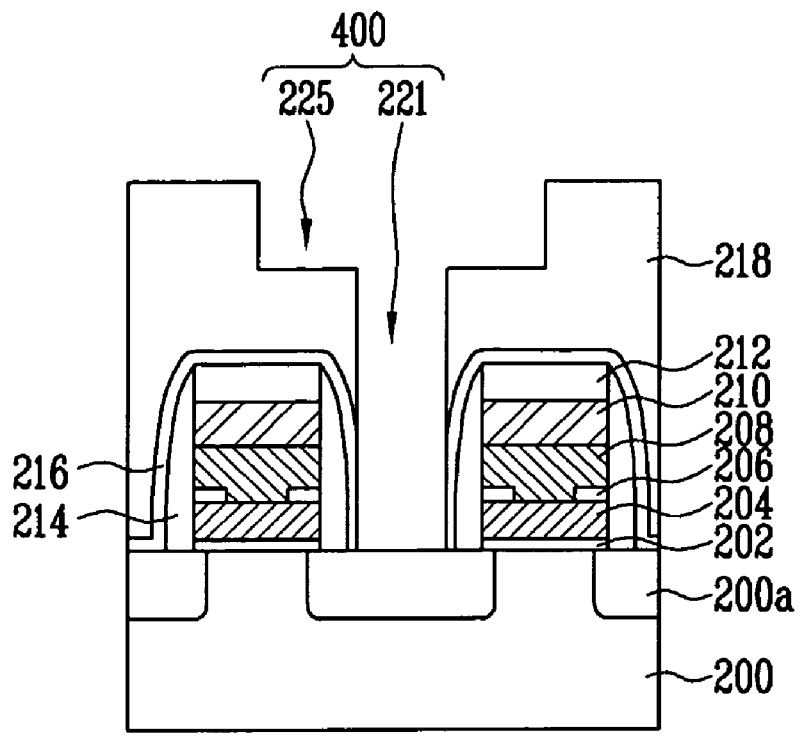

Referring to FIG. 2H, the third hard mask pattern 224 and the passivation layer 222 over the second insulating layer 218, and the passivation layer 222 within the contact hole are removed, thereby forming a dual damascene pattern 400 comprised of the contact hole 221 and the third trench 225.

Figure 2I:
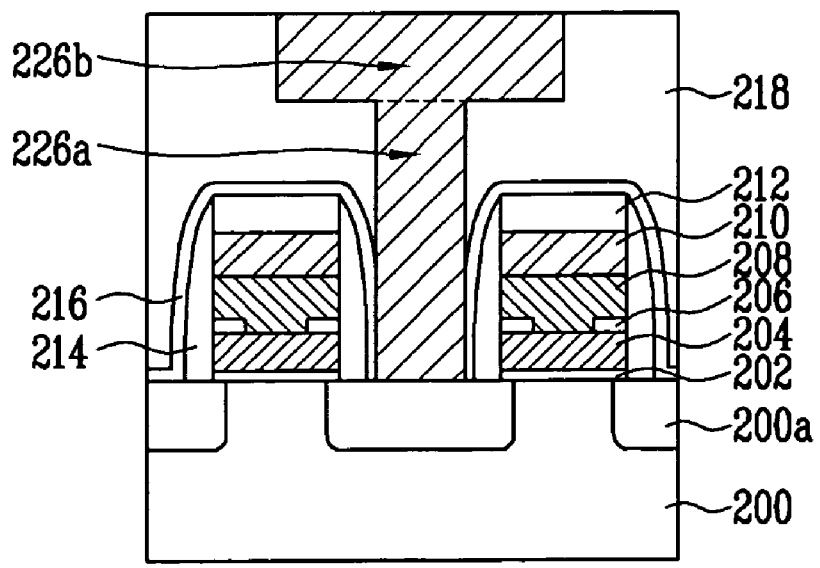

Referring to FIG. 2I, particles, which exist in the dual damascene pattern 400 and its peripheral portions, are removed using a cleaning process. The inside of the dual damascene pattern 400 is gap-filled with a conductive material, thereby forming a contact plug 226a in the contact hole 221 and a line or contact pad 226b in the third trench 225.

According to the present invention, horns, occurring while forming a trench constituting a dual damascene pattern, are removed in an intermediate process of forming the trench. Thus, the source of the particles, which occur due to the horns in a cleaning process performed after the dual damascene pattern is formed, may be completely removed. Accordingly, an increase of contact resistance due to particles may be prevented, and a reduction in the yield of semiconductor devices may also be improved.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A method of forming a dual damascene pattern of a semiconductor device, the method comprising:
    forming an insulating layer over a semiconductor substrate on which elements of the semiconductor device are formed;
    forming a contact hole in the insulating layer;
    forming a passivation layer over the insulating layer and within the contact hole;
    forming a hard mask pattern over the passivation layer, wherein the hard mask pattern exposes the contact hole;
    forming a first trench by etching a portion of the passivation layer and a portion of the insulating layer using a first etch process employing the hard mask pattern as an etch mask;
    etching the passivation layer using a second etch process employing the hard mask pattern as an etch mask, wherein the passivation layer is gap-filled within the contact hole;
    forming a second trench by etching a portion of the insulating layer using a third etch process employing the hard mask pattern as an etch mask, thereby forming a third trench comprising the first trench and the second trench; and
    removing the third hard mask pattern and the passivation layer.

2. The method of claim 1, wherein the insulating layer comprises oxide material.

3. The method of claim 1, wherein the passivation layer comprises a bottom anti-reflection coating (BARC) material.

4. The method of claim 1, wherein the first trench has a depth which is 5% to 50% shallower than that of the third trench.

5. The method of claim 1, wherein the second etch process is performed until a top surface of the passivation layer gap-filled within the contact hole becomes at least lower than a bottom of the third trench.

6. The method of claim 1, wherein the second etch process is performed using a dry etch method such that the passivation layer below the third hard mask pattern is not etched.

7. The method of claim 1, wherein the second etch process is performed using gas with a high etch selectivity for the passivation layer relative to the insulating layer.

8. The method of claim 1, wherein the second etch process is performed using an etch gas, the etch gas including a mixture of $CF_4$ gas and $O_2$ gas, or $O_2$ gas.

9. The method of claim 1, wherein the first etch process and the second etch process are performed using an in-situ method or an ex-situ method.

10. The method of claim 1, further comprising performing a cleaning process after the hard mask pattern and the passivation layer are removed.

11. A method of forming a dual damascene pattern of a semiconductor device, the method comprising:
   forming an insulating layer over a semiconductor substrate and over elements of the semiconductor device formed on the semiconductor substrate;
   forming a contact hole in the insulating layer;
   forming a passivation layer over the insulating layer and within the contact hole;
   forming a hard mask pattern over the passivation layer, wherein the hard mask pattern exposes the contact hole;
   forming a first trench by etching a portion of the passivation layer and a portion of the insulating layer using a first etch process employing the hard mask pattern as an etch mask, wherein horns are formed on the insulating layer proximate the contact hole;
   etching the passivation layer using a second etch process employing the hard mask pattern as an etch mask, wherein the passivation layer gap-fills the contact hole; and
   forming a second trench by etching the insulating layer using a third etch process employing the hard mask pattern as an etch mask, thereby forming a third trench comprising the first trench and the second trench, wherein the horns formed on the insulating layer proximate the contact hole are removed by the third etch process.

12. The method of claim 11, further comprising:
   removing the hard mask pattern and the passivation layer; and
   performing a cleaning process after the hard mask pattern and the passivation layer are removed.

13. The method of claim 11, wherein the insulating layer comprises oxide material.

14. The method of claim 11, wherein the passivation layer comprises a bottom anti-reflection coating (BARC) material.

15. The method of claim 11, wherein the first trench has a depth which is 5% to 50% shallower than that of the third trench.

16. The method of claim 11, wherein the second etch process is performed until a top surface of the passivation layer gap-filled within the contact hole becomes at least lower than a bottom of the third trench.

17. The method of claim 11, wherein the second etch process is performed using a dry etch method such that the passivation layer below the third hard mask pattern is not etched.

18. The method of claim 11, wherein the second etch process is performed using gas with a high etch selectivity for the passivation layer relative to the insulating layer.

19. The method of claim 11, wherein the second etch process is performed using an etch gas, the etch gas including a mixture of $CF_4$ gas and $O_2$ gas, or $O_2$ gas.

20. The method of claim 11, wherein the first etch process and the second etch process are performed using an in-situ method or an ex-situ method.

* * * * *